United States Patent
Gardner et al.

[11] Patent Number: 6,114,228
[45] Date of Patent: Sep. 5, 2000

[54] METHOD OF MAKING A SEMICONDUCTOR DEVICE WITH A COMPOSITE GATE DIELECTRIC LAYER AND GATE BARRIER LAYER

[75] Inventors: Mark I. Gardner, Cedar Creek; Mark C. Gilmer, Austin, both of Tex.

[73] Assignee: Advanced Micro Devices, Inc., Houston, Tex.

[21] Appl. No.: 09/120,245

[22] Filed: Jul. 21, 1998

[51] Int. Cl.⁷ .................... H01L 21/3205; H01L 21/00
[52] U.S. Cl. .................. 438/585; 438/3; 438/240; 438/216; 438/591
[58] Field of Search ................ 438/3, 585, 287, 438/240, 216, 591; 257/295, 310, 405–406, 409–411

[56] References Cited

U.S. PATENT DOCUMENTS

| | | | |
|---|---|---|---|
| 4,151,537 | 4/1979 | Goldman et al. | 257/310 |
| 4,288,470 | 9/1981 | Bate et al. | 427/88 |
| 4,335,391 | 6/1982 | Morris | 257/310 |
| 5,023,679 | 6/1991 | Shibata | 357/23.4 |
| 5,276,347 | 1/1994 | Wei et al. | 257/388 |
| 5,319,229 | 6/1994 | Shimoji et al. | 257/324 |
| 5,619,051 | 4/1997 | Endo | 257/316 |
| 5,625,217 | 4/1997 | Chau et al. | 257/412 |
| 5,650,362 | 7/1997 | Nashimoto | 438/3 |
| 5,763,922 | 6/1998 | Chau | 257/371 |
| 5,789,778 | 8/1998 | Murai | 257/325 |
| 5,811,865 | 9/1998 | Hodges et al. | 257/411 |
| 5,880,508 | 3/1999 | Wu | 438/3 |
| 6,002,150 | 6/1982 | Gardner et al. | 257/310 |
| 6,015,739 | 1/2000 | Gardner et al. | 438/287 |

*Primary Examiner*—Charles Bowers
*Assistant Examiner*—Thanh Nguyen
*Attorney, Agent, or Firm*—Williams, Morgan & Amerson

[57] ABSTRACT

The present invention is directed to a new semiconductor device and a method for making same. The new semiconductor device is comprised of a gate barrier layer, a composite gate dielectric layer, a conductor layer, and at least one source/drain region formed in a semiconducting substrate. The method comprises forming the gate barrier layer, composite gate dielectric layer and conductor layer, patterning those layers, and forming at least one source/drain region in said semiconductor substrate. The composite gate dielectric layer is comprised of at least two different materials having different dielectric constants.

12 Claims, 2 Drawing Sheets

METHOD OF MAKING A SEMICONDUCTOR DEVICE WITH A COMPOSITE GATE DIELECTRIC LAYER AND GATE BARRIER LAYER

BACKGROUND OF THE INVENTION

1. Field of the Invention

This invention is generally directed to semiconductor devices, and, more particularly, to a high performance semiconductor device.

2. Description of the Related Art

Generally speaking, there is a constant drive in the semiconductor industry to make semiconductor devices, i.e., transistors, smaller and smaller. All other things being equal, semiconductor devices with smaller feature sizes tend to be more efficient, i.e., faster, and may be more cost-effective to manufacture in that a greater number of devices can be fabricated on a single wafer.

This constant drive to reduce the feature size of semiconductor devices has resulted in a corresponding scaling of many of the components of a semiconductor device. For example, as the gate length of semiconductor devices decreases, the thickness of the gate dielectric layer, i.e., the gate oxide layer, which has traditionally been made of silicon dioxide, also decreases. However, the reduction in the thickness of traditional silicon dioxide gate dielectric layers has resulted in several problems. For example, when silicon dioxide gate dielectric layers approach a thickness of approximately 20 Å, leakage of current from the conductor to the channel may increase. Additionally, it is difficult to fabricate silicon dioxide gate dielectric layers having a thickness of approximately 20 Å or less with the requisite quality required for gate dielectric layers.

Another problem may arise when a relatively thin silicon dioxide gate dielectric layer is used in a PMOS device. The gate electrode in PMOS devices is generally a doped polysilicon. Such doping is typically accomplished by the addition of boron to the polysilicon gate electrode layer. However, thin silicon dioxide gate dielectric layers, e.g., those having a thickness of approximately 20 Å or less, may not provide a sufficient barrier to prevent the migration of free boron atoms into the semiconductor substrate.

On the other hand, traditional gate oxide layers cannot be made too thick without adversely affecting the performance of the semiconductor devices. As is well known to those skilled in the art, the thickness of traditional gate oxide layers is tightly controlled to assure that the gate oxide layer is thin enough that an appropriate current can be induced in the gate region of a device by applying the appropriate voltage to a conductor above the gate oxide layer. Thus, as the feature size of semiconductor devices continues to decrease, there is a need to produce semiconductor devices having a gate dielectric layer that is dielectrically equivalent to a silicon dioxide gate layer having a thickness below approximately 20 Å.

The present invention is directed to a semiconductor device that solves some or all of the aforementioned problems and a method for making same.

SUMMARY OF THE INVENTION

The present invention is directed to a new semiconductor device and a method for making same. The semiconductor device is comprised of a gate barrier layer positioned above a semiconductor substrate material, a composite gate dielectric layer positioned above the gate barrier layer, and a conductor layer positioned above the composite gate dielectric layer. The composite gate dielectric layer is comprised of at least two different materials having different dielectric constants. The semiconductor device is further comprised of at least one source/drain region formed in the substrate.

The inventive method disclosed herein is comprised of forming a gate barrier layer above the surface of a semiconductor substrate material, forming a composite gate dielectric layer comprised of at least two different materials having different dielectric constants above the gate barrier layer, forming a conductor layer above the composite gate dielectric layer, and patterning the gate barrier layer, composite gate dielectric layer and the conductor layer. The method further comprises forming at least one source/drain region in said semiconducting substrate.

BRIEF DESCRIPTION OF THE DRAWINGS

The invention may be understood by reference to the following description taken in conjunction with the accompanying drawings, in which like reference numerals identify like elements, and in which.

Figure 1:
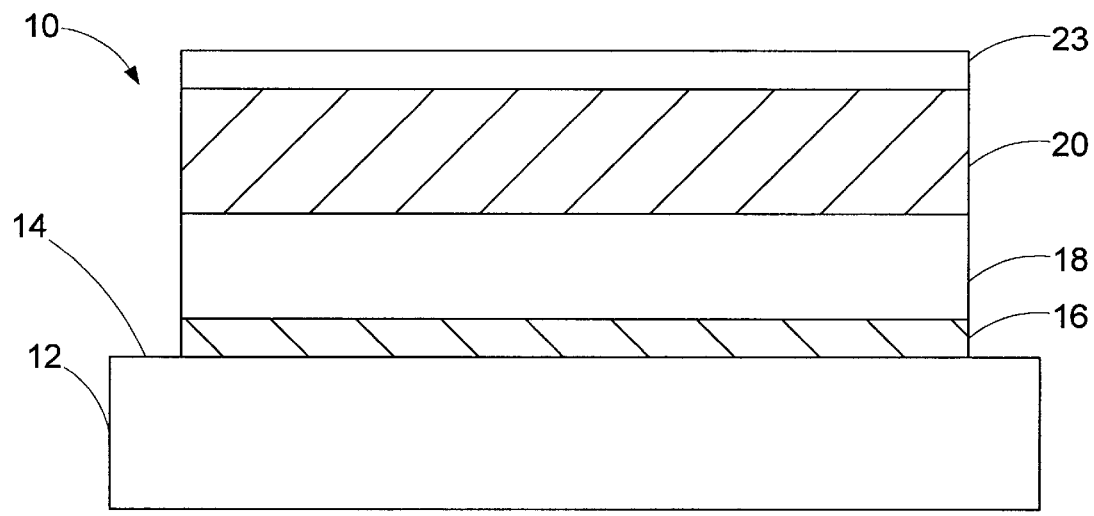
FIG. 1 is a cross-sectional schematic of a partially formed semiconductor device having a gate barrier layer, a composite gate dielectric layer, a conductor layer and a layer of photoresist formed above a substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–3. Although the various regions and structures of a semiconductor device are depicted in the drawings as having very precise, sharp configurations and profiles, those skilled in the art recognize that, in reality, these regions and structures are not as precise as indicated in the drawings, e.g., the regions may have rounded edges. Additionally, the relative size of the features shown in the drawings may be exaggerated or reduced. Nevertheless, the attached drawings are included to provide an illustrative example of the present invention.

As shown in FIG. 1, a semiconductor device 10 is comprised of a semiconductor substrate 12, a gate barrier layer 16, a composite gate dielectric layer 18, a conductor layer 20 and a photoresist layer 23. The gate barrier layer 16 is initially formed above a surface 14 of the substrate 12. Next, the composite gate dielectric layer 18 is formed above the gate barrier layer 16. Thereafter, the conductor layer 20 is formed above the composite gate dielectric layer 18. A layer of photoresist 23 is then formed above the conductor layer 20.

Figure 2:
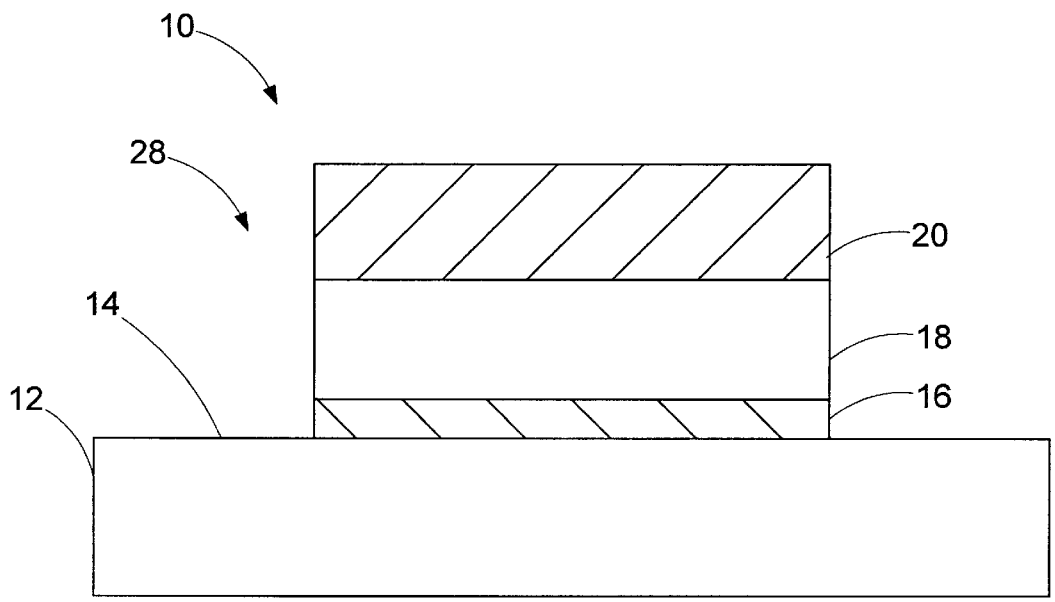
FIG. 2 is a cross-sectional schematic of a partially formed semiconductor device in which portions of the layers shown in FIG. 1 have been removed.

As shown in FIG. 2, the next process involves developing and patterning the photoresist layer 23, and then removing portions of the gate barrier layer 16, the composite gate dielectric layer 18 and the conductor layer 20. The photoresist layer 23 is then removed to leave the resulting structure shown in FIG. 2. As depicted in FIG. 2, the gate barrier layer 16, the composite gate dielectric layer 18 and the conductor layer 20 may be considered collectively as a gate structure 28.

Figure 3:
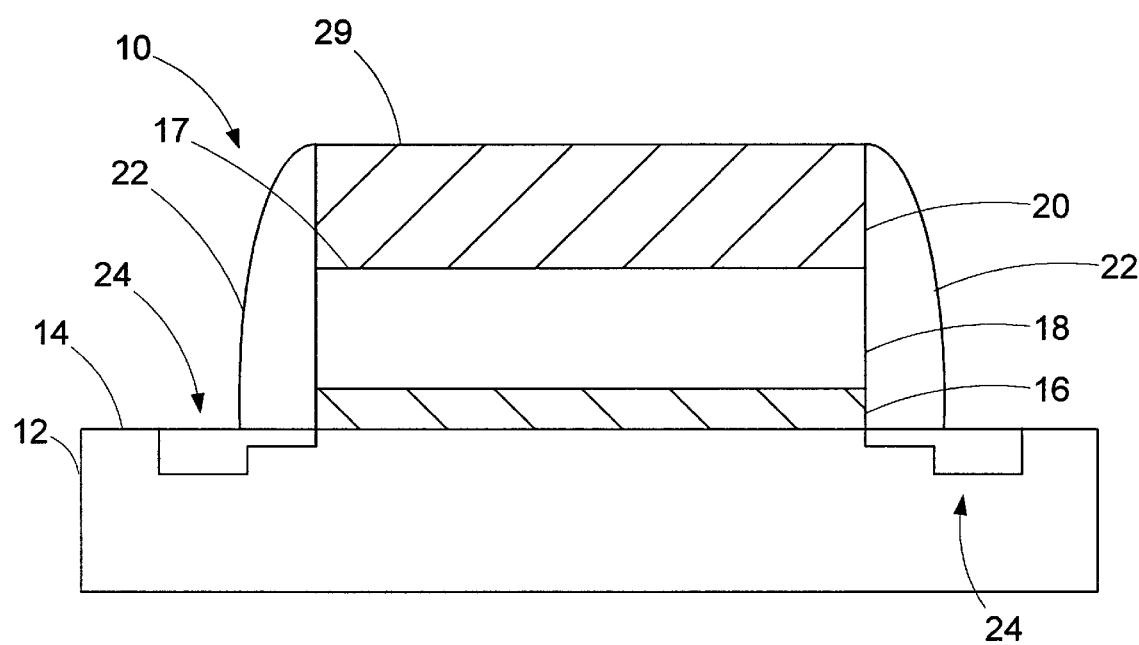
FIG. 3 is a cross-sectional view of a partially formed semiconductor device having a plurality of sidewall spacers formed adjacent the gate barrier layer, the composite gate dielectric layer and the conductor layer.

With reference to FIG. 3, a plurality of sidewall spacers 22 may be formed adjacent the sides of the gate barrier layer 16, the composite gate dielectric layer 18 and the conductor layer 20. Prior to formation of the sidewall spacers 22, illustrative source/drain regions 24 may be partially formed in the substrate 12.

The substrate 12 may be any semiconducting material. In one embodiment, the substrate 12 is silicon. The composite gate dielectric layer 18 is comprised of different materials. In one embodiment, the composite gate dielectric layer 18 is comprised of at least two different materials having different dielectric constants (the symbol for the dielectric constant of a material is "k"). For example, the composite gate dielectric layer 18 may be comprised of at least one material having a relatively high dielectric constant and another material having a relatively low dielectric constant. The composite gate dielectric layer 18 could, of course, be comprised of more than two materials. In one illustrative embodiment of the present invention, the composite materials and their proportions are selected and designed such that the dielectric constant of the composite gate dielectric layer 18 ranges from approximately 400–800.

For example, in one illustrative embodiment, a material such as barium titanate ($BaTiO_3$), which has a dielectric constant in excess of 3000, may be one of the materials used to make the composite gate dielectric layer 18. The other composite material in such an illustrative embodiment may be silicon dioxide ($SiO_2$) or tetraethyl orthosilicate (TEOS), both of which have a dielectric constant of approximately 4. In one illustrative embodiment, the composite gate dielectric layer 18 may be designed to have a dielectric constant of approximately 600. To achieve this result, the composite gate dielectric layer 18 may be comprised of approximately 20% (by volume) of barium titanate (having a dielectric constant in excess of 3000) and 80% of TEOS (having a dielectric constant of approximately 4).

Of course, the composite gate dielectric layer 18 could be comprised of a variety of different materials. For example, the composite gate dielectric layer 18 could be comprised of tantalum pentoxide ($Ta_2O_5$) (having a k value of approximately 25), etc. However, the present invention should not be considered as being limited to the illustrative materials discussed above or the specific dielectric constant of that composite material.

The gate barrier layer 16 is formed above the substrate 12 to prevent the migration of undesirable elements in the gate structure 28, such as, barium or titanium, into the substrate 12. The gate barrier layer 16 may be formed from a variety of materials, such as, silicon nitride or diamond, etc. The gate barrier layer 16 may be formed by a variety of techniques and processes including the method disclosed in our co-pending application entitled "Jet Vapor Reduction of the Thickness of Process Layers," Ser. No. 09/120,056, filed Jul. 21, 1998 which is hereby incorporated by reference in its entirety. In one illustrative embodiment, the gate barrier layer 16 may be a layer of gate quality silicon nitride that may range in thickness from approximately 6–10 Å, and, in one illustrative embodiment, is approximately 8 Å thick. Of course, the material selected for the gate barrier layer 16, as well as the thickness of the gate barrier layer 16, is a matter of design choice that will vary depending on a variety of factors, such as the type of material selected to form the composite gate dielectric layer 18. For example, the gate barrier layer 16 could be made of oxynitride, etc. However, for equivalent thicknesses, a layer of oxynitride may be a less effective barrier layer than a comparable layer of silicon nitride. Generally, it is desirable that the gate barrier layer 16 be as thin as practicable while still providing a sufficient barrier to prevent the migration of unwanted elements from the gate structure 28 into the substrate 12.

In one illustrative embodiment, the composite gate dielectric layer 18 and the gate barrier layer 16 are designed to be dielectrically equivalent to approximately 5–15 Å of silicon dioxide having a dielectric constant of approximately 4. In this illustrative embodiment, the gate barrier layer 16 may be comprised of a 6–10 Å thick layer of silicon nitride (having a dielectric constant of approximately 8). The 6–10 Å layer of silicon nitride is approximately dielectrically equivalent to a 3–5 Å layer of silicon dioxide. For a semiconductor device that is designed to be dielectrically equivalent to 5–15 Å of silicon dioxide, this means that the composite gate dielectric layer 18 must be dielectrically equivalent to 10–12 Å of silicon dioxide (k of approximately 4). If the composite gate dielectric layer 18 has a dielectric constant of approximately 600, then the composite gate dielectric layer 18 may have a thickness ranging from approximately 1500–1800 Å. Of course, the calculations are well known to those skilled in the art, and are only provided as an illustrative example of how the thickness of the various layers may be determined.

The various process layers shown in FIG. 1 may be formed by a variety of techniques known to those skilled in the art. In the illustrated embodiment of the invention disclosed herein, the gate barrier layer 16 may be formed using a variety of processes, including, but not limited to a remote plasma nitride process or a jet nitride deposition process.

Thereafter, the composite gate dielectric layer 18 may be formed above the gate barrier layer 16. In the illustrative embodiment disclosed above, the composite gate dielectric layer 18 has a dielectric constant of approximately 600 and is approximately 1650 Å thick and may be formed by depositing the composite gate dielectric layer 18 using a metal organic chemical vapor deposition process (MOCVD). The process would involve using precursors such as $Ba(O_2C_{11}H_{19})_2$ for the barium titanate ($BaTiO_3$) and tetraethyl orthosilicate ("TEOS"). In one illustrative example, the MOCVD process may be performed at 50–300° C. Of course, the composite gate dielectric layer 18 could be formed using other processes and techniques. For example, the composite gate dielectric layer 18 could be formed using a jet source chemical vapor deposition process that uses an evaporated source for the barium titanate.

The conductor layer 20 may be comprised of a variety of materials. For example, the conductor layer 20 may be made from a variety of metals, including, but not limited to, tungsten and/or tungsten nitride. In one illustrative embodiment, the conductor layer 20 may be made of tungsten nitride and may have a thickness ranging between 1000–2000 Å. The conductor layer 20 may be formed by a variety of processes. For example, the conductor layer 20 may be formed by a chemical vapor deposition process.

As shown in FIGS. 1 and 2, after the photoresist layer 23 has been formed, developed and patterned, portions of the conductor layer 20, composite gate dielectric layer 18 and gate barrier layer 16 are removed to form what may be collectively referred to as the gate structure 28. These layers 16, 18, 20 may be removed by a variety of processes and techniques, and the removal of these layers 16, 18, 20 may be accomplished in single or multiple process steps. In one illustrative embodiment, an initial etching step is used to remove portions of the conductor layer 20. Thereafter, a second etching step is used to remove portions of the composite gate dielectric layer 18 and the gate barrier layer 16. The etching may be performed by, for example, reactive ion etching or plasma etching. The etchant gases used may include $SF_6$ (for the conductor layer 20) and $CHF_3/Ar$ (for the composite gate dielectric layer 18 and the gate barrier layer 16). The removal may also be accomplished by argon milling.

Thereafter, the sidewall spacers 22 may be formed adjacent the conductor layer 20, composite gate dielectric layer 18, and gate barrier layer 16. One purpose of the sidewall spacers 22 is to provide a barrier to prevent the migration of unwanted elements from the gate structure 28 into the substrate 12. In one embodiment of the present invention, the sidewall spacers 22 are formed of silicon nitride. Of course, other materials, such as oxynitride, may be used to form the sidewall spacers 22. However, as discussed above with respect to alternative materials for the gate barrier layer 16, any material selected would desirably reduce the migration of unwanted elements into the substrate 12, while at the same time not be overly thick. In one embodiment in which silicon nitride is used as the spacer material, the width of the sidewall spacers 22 at the surface 14 of the substrate 12 may vary from approximately 30–50 Å. The width of the sidewall spacers 22 may decrease at various heights above the surface 14 of the substrate 12. In one embodiment where the sidewall spacers 22 are made of silicon nitride, the sidewall spacers 22 may have a minimum thickness of at least approximately 50 Å for a distance of about 40 Å extending past the top surface 17 of the composite gate dielectric layer 18.

The sidewalls spacers 22 may be formed by a variety of processes and techniques that may vary with the material selected for the sidewall spacers 22. For example, in one embodiment, the sidewalls spacers 22 are made of silicon nitride and are formed by depositing a layer of silicon nitride above the surface 14 of the substrate 12 and onto at least a portion of a surface 29 of the conductor layer 20. Thereafter, an etching process, such as plasma etching, is used to form the sidewall spacers 22 to the configuration shown in FIG. 3.

Those skilled in the art will recognize the source/drain regions 24 depicted in FIG. 3 have a traditional lightly doped drain (LDD) structure. If an LDD structure is to be used, the initial light doping of the source/drain regions 24 would be performed prior to the formation of the sidewall spacers 22. After the formation of the sidewall spacers 22, a second, heavy doping of the source/drain regions 24 could be performed to complete the formation of the LDD source/drain regions 24. However, the particular method of forming the source/drain regions 24 are not be considered a limitation of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing a semiconductor device above a substrate, said substrate having a surface, said method comprising:

forming a gate barrier layer above said surface of said substrate;

forming a composite gate dielectric layer directly on said gate barrier layer from at least two different materials each having different dielectric constants, wherein at least one of the different dielectric constants is greater than 8;

forming a conductor layer above said composite gate dielectric layer;

patterning said gate barrier layer, said composite gate dielectric layer and said conductor layer; and forming at least one source/drain region in said substrate, wherein said step of forming a gate barrier layer comprises forming a layer of silicon nitride.

2. A method of manufacturing a semiconductor device above a substrate, said substrate having a surface, said method comprising:

forming a gate barrier layer above said surface of said substrate;

forming a composite gate dielectric layer directly on said gate barrier layer from at least two different materials each having different dielectric constants, wherein at least one of the different dielectric constants is greater than 8;

forming a conductor layer above said composite gate dielectric layer;

patterning said gate barrier layer, said composite gate dielectric layer and said conductor layer; and forming at least one source/drain region in said substrate, wherein said step of forming a barrier layer comprises forming a layer of silicon nitride having a thickness ranging from approximately 6–10 Å.

3. A method of manufacturing a semiconductor device above a substrate, said substrate having a surface, said method comprising:

forming a gate barrier layer above said surface of said substrate;

forming a composite gate dielectric layer directly on said gate barrier layer from at least two different materials each having different dielectric constants, wherein at least one of the different dielectric constants is greater than 8;

forming a conductor layer above said composite gate dielectric layer;

patterning said gate barrier layer, said composite gate dielectric layer and said conductor layer; and forming at least one source/drain region in said substrate, wherein forming said composite dielectric layer comprises combining barium titanate with silicon dioxide.

4. A method of manufacturing a semiconductor device above a substrate, said substrate having a surface, said method comprising:

forming a gate barrier layer above said surface of said substrate;

forming a composite gate dielectric layer directly on said gate barrier layer from at least two different materials each having different dielectric constants, wherein at least one of the different dielectric constants is greater than 8;

forming a conductor layer above said composite gate dielectric layer;

patterning said gate barrier layer, said composite gate dielectric layer and said conductor layer; and forming at least one source/drain region in said substrate, wherein forming said composite dielectric layer comprises combining approximately 20% by volume barium titanate with approximately 80% by volume silicon dioxide or tetraethyl orthosilicate (TEOS).

5. A method of manufacturing a semiconductor device above a substrate, said substrate having a surface, said method comprising:

forming a gate barrier layer above said surface of said substrate;

forming a composite gate dielectric layer directly on said gate barrier layer from at least two different materials each having different dielectric constants, wherein at least one of the different dielectric constants is greater than 8;

forming a conductor layer above said composite gate dielectric layer;

patterning said gate barrier layer, said composite gate dielectric layer and said conductor layer; and forming at least one source/drain region in said substrate, wherein forming a composite gate dielectric layer comprises forming a composite gate dielectric layer having a dielectric constant ranging from approximately 400 to 800.

6. A method of manufacturing a semiconductor device above a substrate, said substrate having a surface, said method comprising:

forming a gate barrier layer above said surface of said substrate;

forming a composite gate dielectric layer having a dielectric constant from approximately 400–800 directly on said gate barrier layer, the composite gate dielectric layer including at least two different materials each having different dielectric constants, wherein at least one of the different dielectric constants is greater than 8;

forming a conductor layer above said composite gate dielectric layer;

patterning said gate barrier layer, composite gate dielectric layer and said conductor layer; and forming at least one source/drain region in said substrate.

7. The method of claim 6, further comprising forming sidewall spacers adjacent at least said barrier layer and said composite gate dielectric layer.

8. The method of claim 6, wherein said step of forming a gate barrier layer comprises forming a layer of silicon nitride.

9. The method of claim 6, wherein said step of forming a barrier layer comprises forming a layer of silicon nitride having a thickness ranging from approximately 6–10 Å.

10. The method of claim 6, wherein forming said composite dielectric layer comprises combining barium titanate with silicon dioxide.

11. The method of claim 6, wherein forming said composite dielectric layer comprises combining approximately 20% by volume barium titanate with approximately 80% by volume silicon dioxide or tetraethyl orthosilicate (TEOS).

12. The method of claim 6, wherein forming said composite dielectric layer comprises forming a composite gate dielectric layer having a thickness ranging from approximately 1500–1800 Å.

* * * * *